(12) United States Patent
Kajihara et al.

(10) Patent No.: US 9,313,901 B2
(45) Date of Patent: Apr. 12, 2016

(54) PRINTED WIRING BOARD

(71) Applicant: IBIDEN CO., LTD., Ogaki (JP)

(72) Inventors: Kazuki Kajihara, Ogaki (JP); Yasuki Kimishima, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 14/446,702

(22) Filed: Jul. 30, 2014

(65) Prior Publication Data

US 2015/0034378 A1 Feb. 5, 2015

(30) Foreign Application Priority Data

Jul. 31, 2013 (JP) ................................ 2013-158455

(51) Int. Cl.

| H05K 1/11 | (2006.01) |
|---|---|
| H05K 3/42 | (2006.01) |
| H05K 1/03 | (2006.01) |
| H05K 3/00 | (2006.01) |
| H05K 3/46 | (2006.01) |

(52) U.S. Cl.
CPC .............. *H05K 3/427* (2013.01); *H05K 1/0366* (2013.01); *H05K 3/0047* (2013.01); *H05K 3/429* (2013.01); *H05K 3/4602* (2013.01); *H05K 2201/0355* (2013.01); *H05K 2201/09536* (2013.01); *H05K 2203/1476* (2013.01); *H05K 2203/1492* (2013.01)

(58) Field of Classification Search
CPC ........... H05K 1/11; H05K 1/162; H05K 3/10; H05K 3/22; H05K 3/42; H01L 21/02; H01L 21/27; H01L 21/288; H01L 21/768; H01L 23/12; H01L 23/15; H01L 23/48; H01L 23/52; H01L 23/53

USPC ................. 174/266, 256, 257, 264; 428/472; 438/662, 687; 257/621, 700, 758; 29/846, 852

See application file for complete search history.

(56) References Cited

U.S. PATENT DOCUMENTS

| 6,329,065 B1 * | 12/2001 | Ishida ..................... H01L 23/15 174/256 |
| 2002/0115292 A1 * | 8/2002 | Andricacos ......... H01L 21/2885 438/687 |
| 2002/0134685 A1 * | 9/2002 | Chakravorty .......... H05K 1/162 205/125 |

(Continued)

FOREIGN PATENT DOCUMENTS

JP 2005-093934 4/2005

OTHER PUBLICATIONS

U.S. Appl. No. 14/261;804, filed Apr. 25, 2014, Kajihara.

*Primary Examiner* — Xiaoliang Chen
(74) *Attorney, Agent, or Firm* — Oblon, McClelland, Maier & Neustadt, L.L.P.

(57) ABSTRACT

A printed wiring board includes an insulative resin substrate having a penetrating hole, a first conductive layer formed on first surface of the substrate, a second conductive layer formed on second surface of the substrate on the opposite side, and a through-hole conductor formed in the penetrating hole and connecting the first and second conductive layers. The through-hole conductor includes a seed layer on inner wall of the penetrating hole, a first electrolytic plated layer on the seed layer such that the first plated layer is filling the space formed by the seed layer in the penetrating hole and forming recesses at the ends of the penetrating hole, respectively, and second electrolytic plated layers filling the recesses, respectively, and the second plated layers includes electrolytic plating having an average crystalline particle diameter greater than an average crystalline particle diameter of electrolytic plating forming the first plated layer.

20 Claims, 3 Drawing Sheets

(56) References Cited

U.S. PATENT DOCUMENTS

2005/0048770 A1* 3/2005 Mashino .................. H05K 3/22
 438/662

2009/0189256 A1* 7/2009 Yoshimura .......... H01L 21/6835
 257/621
2010/0163297 A1* 7/2010 Kajihara .............. H05K 3/0032
 174/264

* cited by examiner

PRINTED WIRING BOARD

CROSS-REFERENCE TO RELATED APPLICATIONS

The present application is based upon and claims the benefit of priority to Japanese Patent Application No. 2013-158455, filed Jul. 31, 2013, the entire contents of which are incorporated herein by reference.

BACKGROUND OF THE INVENTION

1. Field of the Invention

The present invention relates to a printed wiring board with a through-hole conductor.

2. Description of Background Art

JP2005-093934A describes a method for forming a columnar through hole in a substrate, forming a metal microfilm layer as a seed layer on the inner-wall surface of the through hole, and filling the through hole with electrolytic plating. The metal deposition speed of the electrolytic plating solution used in JP2005-093934A is faster in the through hole than on surfaces of the substrate. The entire contents of this publication are incorporated herein by reference.

SUMMARY OF THE INVENTION

According to one aspect of the present invention, a printed wiring board includes an insulative resin substrate having a penetrating hole, a first conductive layer formed on a first surface of the insulative resin substrate, a second conductive layer formed on a second surface of the insulative resin substrate on the opposite side with respect to the first surface, and a through-hole conductor formed in the penetrating hole and connecting the first conductive layer and the second conductive layer. The through-hole conductor includes a seed layer formed on an inner wall of the penetrating hole, a first electrolytic plated layer formed on the seed layer such that the first electrolytic plated layer is filling a space formed by the seed layer in the penetrating hole and forming recessed portions at end portions of the penetrating hole, respectively, and second electrolytic plated layers filling the recessed portions formed by the first electrolytic plated layer, respectively, and the second electrolytic plated layers include electrolytic plating having an average crystalline particle diameter which is greater than an average crystalline particle diameter of electrolytic plating forming the first electrolytic plated layer.

According to another aspect of the present invention, a method for manufacturing a printed wiring board includes forming a penetrating hole through an insulative resin substrate, forming a first conductive layer on a first surface of the insulative resin substrate, forming a second conductive layer on a second surface of the insulative resin substrate on the opposite side with respect to the first surface, and forming in the penetrating hole a through-hole conductor connecting the first conductive layer and the second conductive layer. The forming of the through-hole conductor includes forming a seed layer on an inner wall of the penetrating hole, forming on the seed layer a first electrolytic plated layer such that the first electrolytic plated layer fills the space formed by the seed layer in the penetrating hole and forms recessed portions at end portions of the penetrating hole, respectively, and forming second electrolytic plated layers such that the second electrolytic plated layers fill the recessed portions formed by the first electrolytic plated layer, respectively, and the forming of the second electrolytic plated layers include forming electrolytic plating having an average crystalline particle diameter which is greater than an average crystalline particle diameter of electrolytic plating forming the first electrolytic plated layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
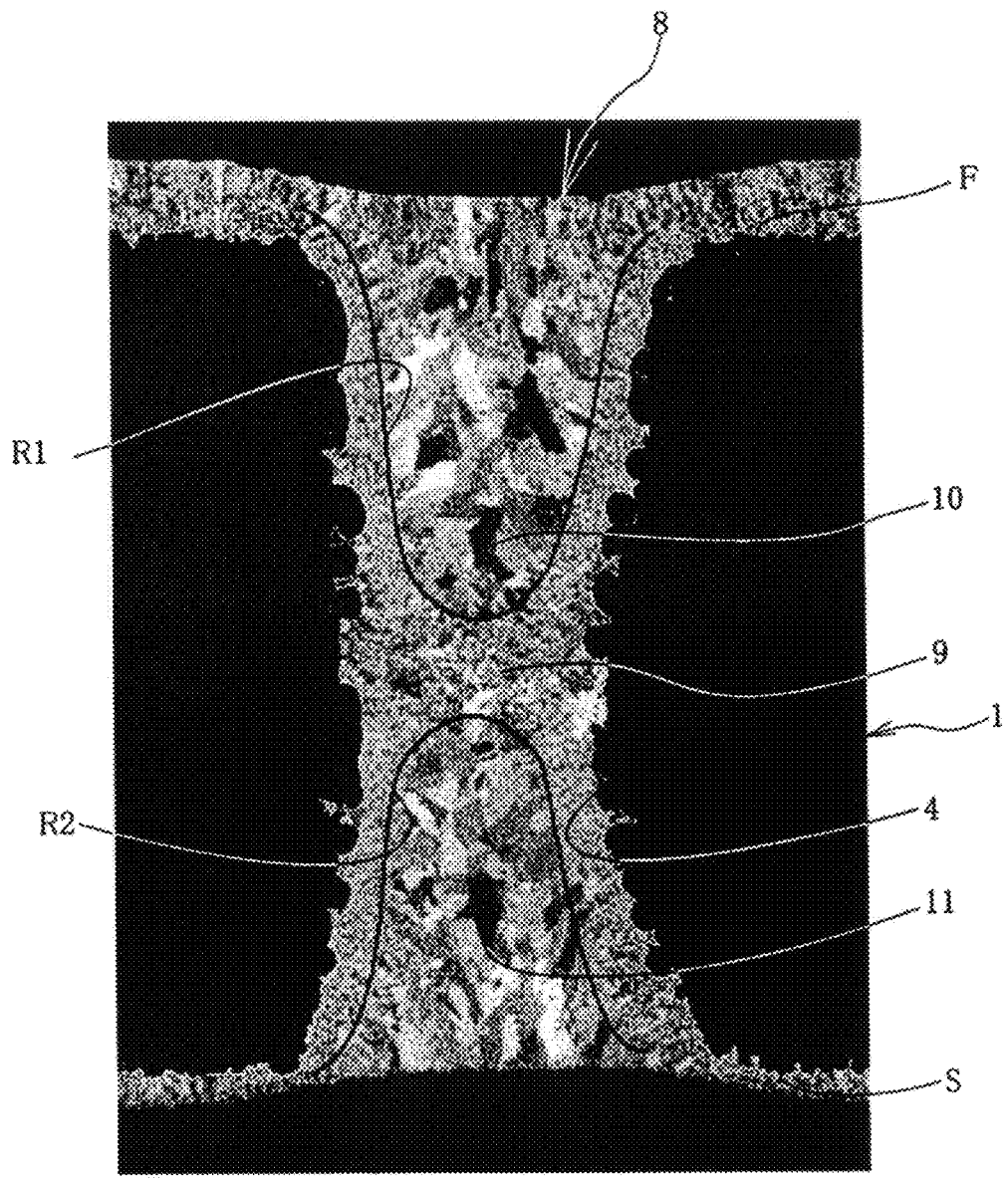
FIG. 1 is an electron microscopic image showing an enlarged cross-sectional view of a through-hole conductor in a printed wiring board according to an embodiment of the present invention.

The embodiments will now be described with reference to the accompanying drawings, wherein like reference numerals designate corresponding or identical elements throughout the various drawings.

A printed wiring board according to an embodiment of the present invention is described below in detail.

Figure 2:
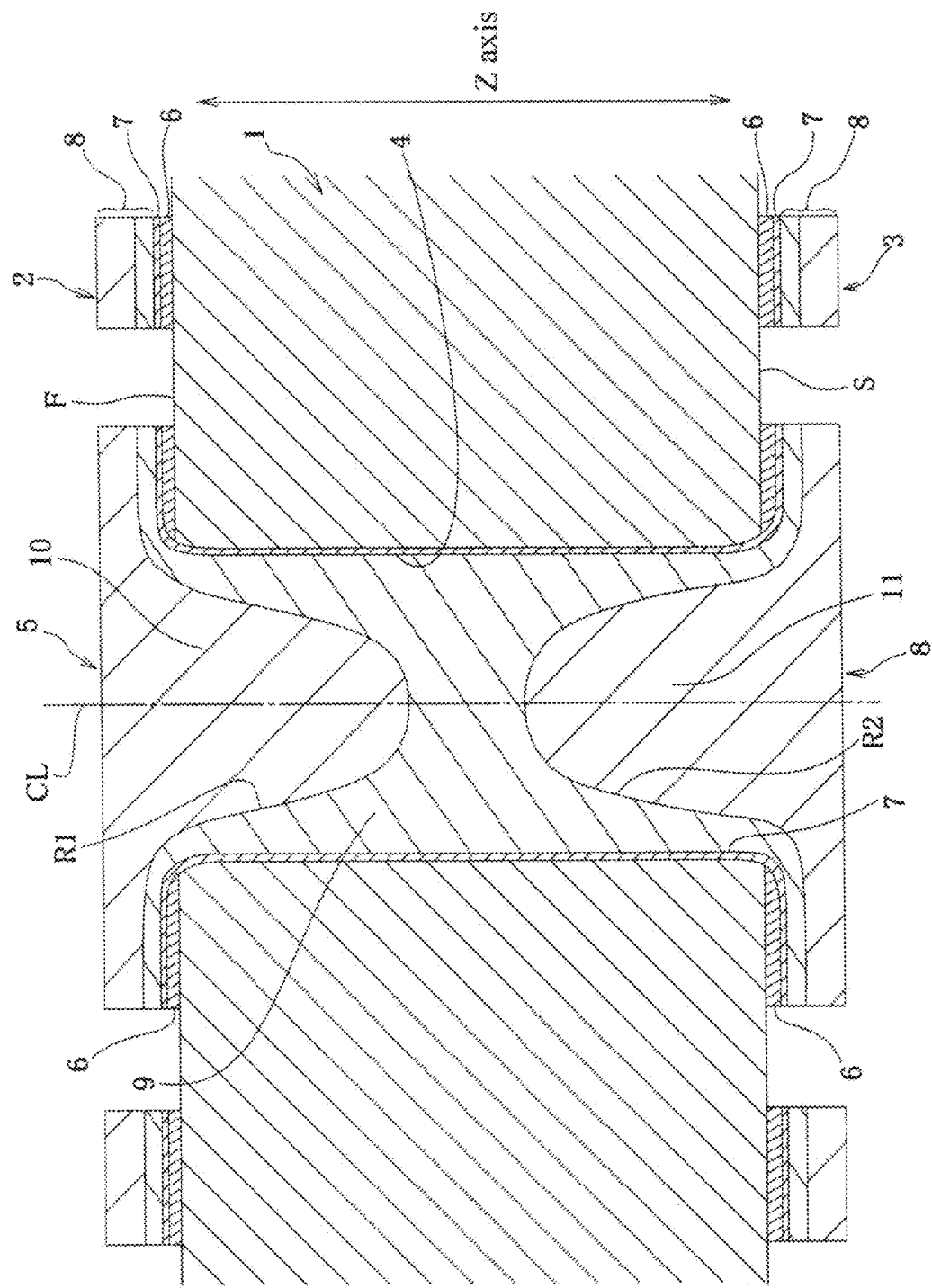
FIG. 2 is a cross-sectional view schematically illustrating a cross section of a through-hole conductor in a printed wiring board according to the embodiment.

FIG. 1 is an electron microscopic image showing an enlarged cross-sectional view of a through-hole conductor of a printed wiring board according to an embodiment of the present invention. FIG. 2 is a cross-sectional view schematically illustrating a through-hole conductor in a printed wiring board of the present embodiment. A method for forming a sample shown in FIG. 1 is described below.

First, a through-hole conductor is shaved by a microtome so that a cross section of the through-hole conductor is exposed. Next, the cross section of the through-hole conductor is microscopically processed by ion milling or focused ion-beam milling. Accordingly, a sample for observing its cross section is obtained. The sample is observed using an FE-SEM (Field Emission-Scanning Electron Microscope) or the like.

A method for forming a sample and observing the sample is shown below.

Microtome
   instrument: Microtome (model number: RM2165/RM2265) made by Leica Microsystems Microscopic Processing
   method: Ar ion milling
   instrument: Cross Section Polisher (model number: SM-09010) made by JEOL Ltd.
   conditions: accelerating voltage: 4~6 kV, electric current: 20 µA~40 µA Observation
   method: FE-SEM (field emission-scanning electron microscope)
   instrument: FE-SEM (model number JSM-7001) made by JEOL Ltd.
   magnification: 350~30,000 times
   accelerating voltage: 7.0 kV
   remarks: backscattered electron image As shown in FIG. 2, a printed wiring board of the present embodiment has insulative resin substrate 1 having first surface (F) and second surface (S) opposite the first surface, first conductive layer 2 formed on first surface (F) of insulative resin substrate 1, second conductive layer 3 formed on second surface (S) of insulative resin substrate 1, and through-hole conductor 5 which penetrates through insulative resin substrate 1 and electrically connects first conductive layer 2 and second conductive layer 3. Through-hole conductor 5 is formed in penetrating hole 4 of insulative resin substrate 1.

Insulative resin substrate 1 is formed with cured resin and reinforcing material such as glass cloth. First and second conductive layers (2, 3) include multiple conductive circuits and are each formed with metal foil (copper foil) 6 laminated on insulative resin substrate 1, electroless plated layer (electroless copper-plated layer) 7 formed on metal foil 6, and electrolytic plated layer (electrolytic copper-plated layer) 8 formed on electroless plated layer 7.

Penetrating hole (penetrating hole for a through-hole conductor) 4 of insulative resin substrate 1 is formed to be a straight hole, and through-hole conductor 5 is made up of electroless plated layer (electroless copper-plated layer) 7 formed as a seed layer on the inner wall of penetrating hole 4, and of electrolytic plated layer (electrolytic copper-plated layer) 8 formed on electroless plated layer 7. Penetrating hole 4 is filled with electrolytic plated layer 8.

Electrolytic plated layer 8 of through-hole conductor 5 includes first electrolytic plated layer 9 which is formed along electroless plated layer 7 and which closes penetrating hole 4 at substantially its center portion. Because of first electrolytic plated layer 9, first recess (R1) and second recess (R2) are formed on the first-surface (F) side and the second-surface (S) side respectively. In addition, through-hole conductor 5 has second electrolytic plated layers (10, 11) that respectively fill recesses (R1) and (R2).

As shown in FIG. 1, the size of crystalline particles of the electrolytic plating that forms first electrolytic plated layer 9 is greater than the size of crystalline particles of the electrolytic plating that forms second electrolytic plated layers (10, 11). The crystalline particle diameter of first electrolytic plated layer 9 is 0.3~10 μm, for example, and the crystalline particle diameter of second electrolytic plated layers (10, 11) is 5~30 μm, for example. The crystalline particle diameter of first electrolytic plated layer 9 is relatively small, and the crystalline particle diameter of second electrolytic plated layers (10, 11) is relatively large. The crystalline particle diameter of second electrolytic plated layers (10, 11) is 7~15 times the crystalline particle diameter of first electrolytic plated layer 9.

The crystals in the plated film of first electrolytic plated layer 9 are preferred not to be oriented. For example, if first electrolytic plated layer 9 is formed by laminating layered crystals, heat cycles or the like may cause delamination of crystals in first electrolytic plated layer 9 or cracking in first electrolytic plated layer 9. To prevent such problems, crystals of first electrolytic plated layer 9 are preferred to have grown at random.

In the present embodiment, penetrating hole 4 for a through-hole conductor is shaped in substantially a column. In penetrating hole 4 of such a shape, through-hole conductor 5 is formed with first electrolytic plated layer 9 which has grown from the hole wall toward central axis (CL) of penetrating hole 4, and with second electrolytic plated layers (10, 11) that respectively fill recesses (R1, R2) formed by first electrolytic plated layer 9. Central axis (CL) is shown in FIG. 2.

First electrolytic plated layer 9 has grown from the hole wall toward the central axis of penetrating hole 4. In other words, first electrolytic plated layer 9 has grown in a direction parallel to first surface (F) of insulative resin substrate 1. Therefore, portions of first electrolytic plated layer 9 that grow respectively from opposing wall surfaces make contact with each other in a position approximately at central axis (CL). Accordingly, when warping or the like occurs in the printed wiring board, stress originating at the point (contact point) where portions of first electrolytic plated layer 9 growing from opposing wall surfaces touch each other is thought to be exerted on first electrolytic plated layer 9. Because of such stress, cracking may occur in first electrolytic plated layer 9. However, in the present embodiment, the size of crystalline particles of the plated layer that forms first electrolytic plated layer 9 is greater than the size of crystalline particles of the plated layer that forms second electrolytic plated layers (10, 11). Thus, the degree of toughness of first electrolytic plated layer 9 is high. Accordingly, even if stress concentrates on the contact point, cracking is unlikely to occur in first electrolytic plated layer 9.

In addition, recesses (R1, R2) formed in penetrating hole 4 are filled with second electrolytic plated layers (10, 11) in the present embodiment as described above. Since second electrolytic plated layers (10, 11) fill recesses (R1, R2), second electrolytic plated layers (10, 11) are grown in a direction substantially perpendicular to first surface (F) of insulative resin substrate 1 (direction of axis Z). Axis (Z) is shown in FIG. 2.

Through-hole conductor 5 is provided in penetrating hole 4 which penetrates through insulative resin substrate (insulative substrate) 1 made of cured resin and reinforcing material such as glass cloth. Here, glass cloth of insulative substrate 1 is provided in a direction substantially parallel to first surface (F) of insulative substrate 1. Thus, in a direction parallel to first surface (F) of insulative substrate 1, the thermal expansion coefficient of insulative substrate 1 is low, whereas, in a direction perpendicular to first surface (F) of insulative substrate 1, the thermal expansion coefficient of insulative substrate 1 is high. Therefore, second electrolytic plated layers (10, 11) growing in a direction of axis (Z) are preferred to have a high degree of ductility. For that matter, the size of crystalline particles of the plated layer that forms second electrolytic plated layers (10, 11) is preferred to be greater than the size of crystalline particles of the plated layer that forms first electrolytic plated layer 9. To enhance the reliability of through-hole conductor 5 against stress in a direction of axis (Z), the plated layer that fills most of penetrating hole 4 is preferred to be second electrolytic plated layers (10, 11). Here, the plated layer that fills most of penetrating hole 4 indicates a plated layer that fills a space greater than 50% of the volume of penetrating hole 4. If second electrolytic plated layers (10, 11) occupy 65% or more of the volume of penetrating hole 4, change in the resistance of through-hole conductor 5 is reduced during heat cycles. Penetrating hole 4 is preferred to be filled with highly ductile plating.

As described, through-hole conductor 5 of the printed wiring board in the present embodiment is made up of first electrolytic plated layer 9 with a high degree of toughness and of second electrolytic plated layers (10, 11) with a high degree of ductility. Penetrating hole 4 is closed by first electrolytic plated layer 9 and its recesses are filled with second electrolytic layers (10, 11). Thus, even if stress is exerted on through-hole conductor 5 by a heat cycle or the like, problems such as cracking are unlikely to occur in through-hole conductor 5. For example, the effects are verified by comparing the resistance of through-hole conductor 5 before and after a heat cycle.

A printed wiring board of the present embodiment may be used as a core substrate in a buildup wiring board shown in JP2000-101243A. A method for manufacturing a buildup wiring board is described in JP2000-101243A. The entire contents of this publication are incorporated herein by reference.

Manufacturing steps of a printed wiring board according to the present embodiment are shown in the following.

(1) A commercially available double-sided copper-clad laminate is prepared as a starting material. The thickness of insulative resin substrate 1 of the double-sided copper-clad laminate is approximately 100 μm. Penetrating hole 4 is formed in the double-sided copper-clad laminate by a drill. The diameter of the penetrating hole is 80 μm.

(2) On the surface of copper foil 6 on both surfaces of the double-sided copper-clad laminate and on the inner wall of penetrating hole 4, electroless copper plating is performed to form electroless plated layer 7 as a seed layer. The thickness of electroless plated layer 7 is 0.3~3.0 μm.

Examples of the electroless plating solution and plating conditions are shown below.

| Electroless Copper Plating Solution | |
| --- | --- |
| NiSO₄ | 0.003 mol/L |
| tartaric acid | 0.200 mol/L |
| copper sulfate | 0.030 mol/L |
| HCHO | 0.050 mol/L |
| NaOH | 0.100 mol/L |
| α,α'-dipyridyl | 100 mg/L |
| polyethylene glycol | 0.10 g/L |

| Conditions for Electroless Copper Plating | |
| --- | --- |
| time | 40 minutes |
| temperature | 34° C. |

(3) Next, first electrolytic plated layer 9 is formed along electroless plated layer 7 by pulse plating. As shown in FIG. 2, as electrolytic plating progresses, the thickness of first electrolytic plated layer 9 increases in a direction toward central axis (CL) of penetrating hole 4. Then, portions of first electrolytic plated layer 9 growing from the inner wall of penetrating hole 4 toward central axis (CL) join together at approximately the center of penetrating hole 4. Penetrating hole 4 is closed by first electrolytic plated layer 9. First recess (R1) is formed on the first-surface (F) side of insulative resin substrate 1, and second recess (R2) is formed on the second-surface (S) side of insulative resin substrate 1.

Following are examples of the composition of the electrolytic copper plating solution and plating temperature for forming first electrolytic plated layer 9.

The crystalline particle diameter of first electrolytic plated layer 9 is finer than the crystalline particle diameter of second electrolytic plated layers (10, 11) (see FIG. 1.) Due to its fine particle diameter, first electrolytic plated layer 9 is adhered strongly onto the electroless plated layer 7 formed on the inner wall of penetrating hole 4.

First electrolytic plated layer 9 is also formed on metal foil 6.

| Electrolytic Copper Plating Solution | |
| --- | --- |
| sulfuric acid | 0.5 mol/L |
| copper sulfate | 0.8 mol/L |
| additive (iron sulfate, for example) | 5 g/L |
| leveling agent | 50 mg/L |
| brightener | 50 mg/L |

| Conditions for Electrolytic Copper Plating | |
| --- | --- |
| current density Dk1 | 1~5 A/dm² |
| current density Dk2 | 2~20 A/dm² |
| time | 30 minutes (plating time at Dk1 > plating time at Dk2) |
| temperature | 34 ± 2° C. |

Figure 3:
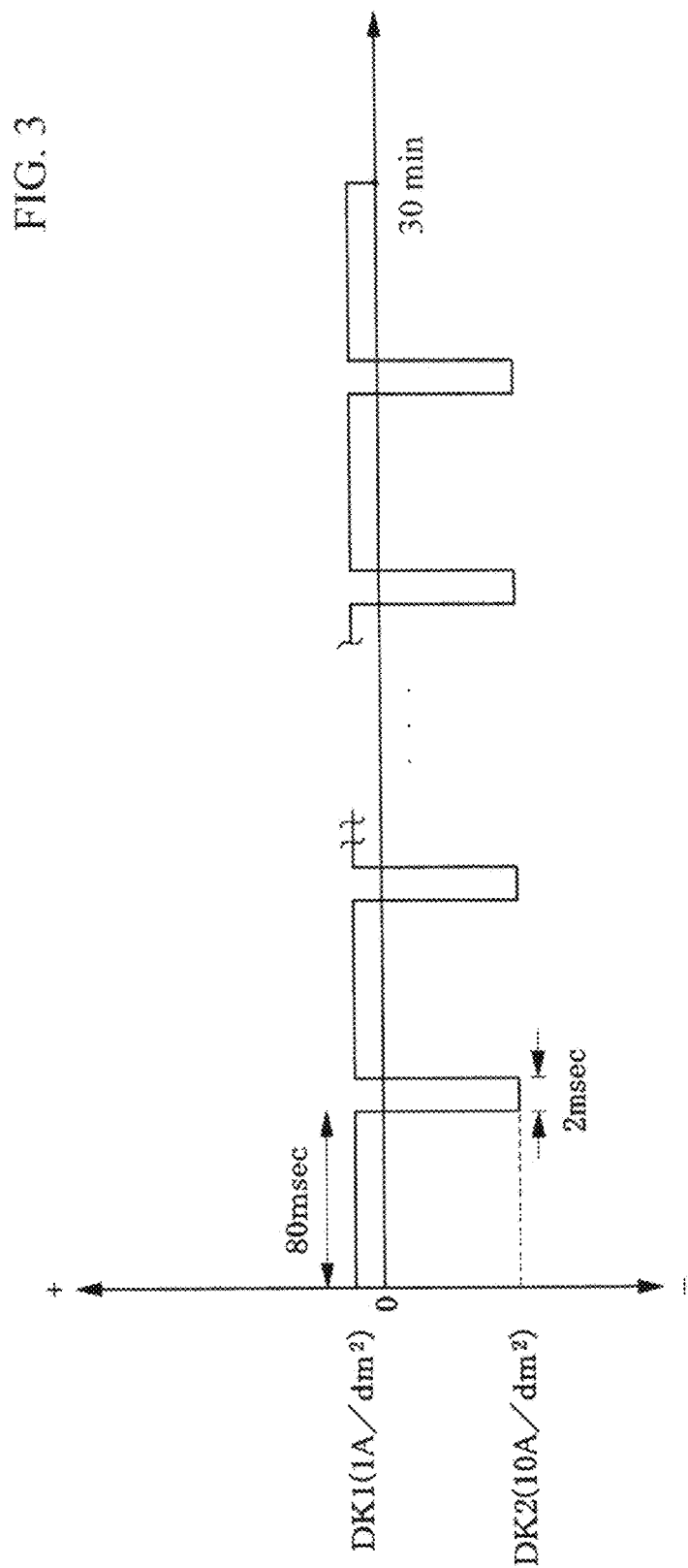
FIG. 3 is an example of pulse waves for forming a first electrolytic plated layer of a through-hole conductor in a printed wiring board according to the embodiment.

FIG. 3 shows an example of pulse waves for forming first electrolytic plated layer 9. The horizontal axis shows time, and the vertical axis shows current density. The pulse plating shown in FIG. 3 is electrolytic plating using pulse periodical reverse (PPR) current, in which electric current changes its direction periodically. When the value of the vertical axis is plus, first electrolytic plated layer 9 is deposited on electroless plated layer 7, whereas when the value of the vertical axis is minus, first electrolytic plated layer 9 is dissolved. For example, by increasing plating speed, by employing pulse plating, by adding an additive or by adjusting plating temperature, the particle diameter of the crystals in first electrolytic plated layer 9 is reduced. In addition, in the present embodiment, the current density (Dk1) during deposition is lower than the current density (Dk2) during dissolution as shown in FIG. 3. Thus, at the central portion in a cross-sectional direction of penetrating hole 4, the deposition speed of first electrolytic plated layer 9 is faster than the deposition speed of first electrolytic plated layer 9 at both ends in a cross-sectional direction of penetrating hole 4. Accordingly, the central portion in a cross-sectional direction of penetrating hole 4 is closed by first electrolytic plated layer 9. As a result, first electrolytic plated layer 9 forms first and second recesses (R1, R2) in penetrating hole 4. To increase the difference between the crystalline particle diameter of first electrolytic plated layer 9 and the crystalline particle diameter of second electrolytic plated layers (10, 11), Dk2/Dk1 is preferred to be 5~20.

(4) Next, second electrolytic plated layer 10 is formed in first recess (R1) while second electrolytic plated layer 11 is formed in second recess (R2). First and second recesses (R1, R2) are filled with electrolytic copper plating.

Following are examples of the composition of the electrolytic copper plating solution and conditions for forming second electrolytic plated layers (10, 11).

| Electrolytic Copper Plating Solution | |
| --- | --- |
| sulfuric acid | 2.24 mol/L |
| copper sulfate | 0.26 mol/L |
| leveling agent | 50 mg/L |
| brightener | 50 mg/L |

| Conditions for Electrolytic Copper Plating | |
| --- | --- |
| current density | 3~5 A/dm² |
| time | 15 minutes |
| temperature | 22 ± 2° C. |

Second electrolytic plated layers (10, 11) are formed using direct current. In addition, since the distance from an edge of penetrating hole 4 to each bottom of first and second recesses (R1, R2) is short, the plating solution is fully supplied into the recesses. Thus, the particle diameter of the crystals in second electrolytic layers (10, 11) is thought to be formed greater than the particle diameter of the crystals in first electrolytic plated layer 9 (see FIG. 1). The deposition speed for forming second electrolytic plated layers (10, 11) is faster than the deposition speed for forming first electrolytic plated layer 9. Second electrolytic plated layers (10, 11) are also formed on first electrolytic layer 9 on insulative resin substrate 1.

(5) Etching resist is formed on second electrolytic plated layers (10, 11).

(6) Second electrolytic plated layers (10, 11), first electrolytic plated layer 9, electroless plated layer 7 and metal foil 6, which are exposed from the etching resist, are removed by etching.

(7) The etching resist is removed. Accordingly, the core substrate (printed wiring board) shown in FIG. 2 is completed.

Although second electrolytic plated layers (10, 11) are formed by direct-current plating, it is also an option to form second electrolytic plated layers (10, 11) by pulse plating. The top surfaces of second electrolytic plated layers (10, 11) formed in first and second recesses (R1, R2) are preferred to be on the same height level of the top surfaces of first and second conductive layers (2, 3) respectively. When the top surfaces (the surfaces opposite the bottom) of second electrolytic plated layers (10, 11) in penetrating hole 4 reach approximately the same level as first surface (F) and second surface (S) respectively of insulative resin substrate 1, it indicates that first and second recesses (R1, R2) are filled. The core substrate is ready for forming buildup layers.

Example

FIG. 3 shows an example of pulse waves for forming first electrolytic plated layer 9 in through-hole conductor 5 shown in FIG. 1. First electrolytic plated layer 9 in the example is formed by alternately repeating Dk1 and Dk2 as shown in FIG. 3. The time for one pulse of Dk1 is longer than the time for one pulse of Dk2. The value of Dk2 is 5~20 times the value of Dk1. First electrolytic plated layer 9 of the example is formed using the plating solution and plating conditions shown below:
Electrolytic Copper Plating Solution
sulfuric acid 0.5 mol/L
copper sulfate 0.8 mol/L
additive (iron sulfate, for example) 5 g/L
leveling agent 50 mg/L
brightener 50 mg/L
Conditions for Electrolytic Copper Plating
current density Dk1 1~5 A/dm$^2$
current density Dk2 2~20 A/dm$^2$
time 30 minutes (plating time at Dk1>plating time at Dk2)
temerature 34±2° C. In the example, Dk1 is 1 A/dm$^2$, and Dk2 is 10 A/dm$^2$. Plating time is 30 minutes. Next, using the plating solution and plating conditions shown in below, second electrolytic plated layers (10, 11) are formed by direct-current plating.
Electrolytic Copper Plating Solution
sulfuric acid 2.24 mol/L
copper sulfate 0.26 mol/L
leveling agent 50 mg/L
brightener 50 mg/L
Conditions for Electrolytic Copper Plating
current density 3~5 A/dm$^2$
time 15 minutes
temerature 22±2° C. The current density is 3 A/dm$^2$. Then, a printed wiring board shown in FIG. 2 is manufactured using a known subtractive method.

To lower the resistance of a through-hole conductor or to decrease the diameter of a penetrating hole for a through-hole conductor, the penetrating hole for a through-hole conductor may be filled with plating.

For example, electrolytic plating is deposited from a side wall of a penetrating hole (through hole) for a through-hole conductor toward the central axis of the through hole, and then a predetermined portion of the through hole is closed by plating. When the plating process is continued, the penetrating hole is filled with electrolytic plating and a through-hole conductor is formed. Thus, the entire electrolytic plated film of the through-hole conductor is thought to have crystals with a uniform particle diameter.

A printed wiring board according to an embodiment of the present invention enhances the reliability of a through-hole conductor.

A printed wiring board according to an embodiment of the present invention has the following: an insulative resin substrate which has a first surface and a second surface opposite the first surface and which includes a penetrating hole for a through-hole conductor; a first conductive layer formed on the first surface of the insulative resin substrate; a second conductive layer formed on the second surface of the insulative resin substrate; a through-hole conductor which is formed in the penetrating hole and connects the first conductive layer and the second conductive layer, and which is made up of a seed layer formed on the inner wall of the penetrating hole, a first electrolytic plated layer that is formed on the seed layer and closes the penetrating hole, and a second electrolytic plated layer that fills a recessed portion formed by the first electrolytic plated layer. In such a printed wiring board, the crystalline particle diameter of the electrolytic plating that forms the second electrolytic plated layer is greater than the crystalline particle diameter of the electrolytic plating that forms the first electrolytic plated layer.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   an insulative resin substrate having a penetrating hole;
   a first conductive layer formed on a first surface of the insulative resin substrate;
   a second conductive layer formed on a second surface of the insulative resin substrate on an opposite side with respect to the first surface; and
   a through-hole conductor formed in the penetrating hole and connecting the first conductive layer and the second conductive layer,
   wherein the through-hole conductor includes a seed layer formed on an inner wall of the penetrating hole, a first electrolytic plated layer formed on the seed layer such that the first electrolytic plated layer is filling a space formed by the seed layer in the penetrating hole and forming recessed portions at end portions of the penetrating hole, respectively, and a plurality of second electrolytic plated layers filling the recessed portions formed by the first electrolytic plated layer, respectively, and the second electrolytic plated layers comprise electrolytic plating having an average crystalline particle diameter which is greater than an average crystalline particle diameter of electrolytic plating forming the first electrolytic plated layer.

2. A printed wiring board according to claim 1, wherein the first electrolytic plated layer is formed by PPR current electrolytic plating.

3. A printed wiring board according to claim 2, wherein the PPR current electrolytic plating is set such that a current density of dissolution is in a range of 5 to 20 times greater than a current density for deposition.

4. A printed wiring board according to claim 1, wherein the average crystalline particle diameter of the second electrolytic plated layers is in a range of 7 to 15 times greater than the average crystalline particle diameter of the first electrolytic plated layer.

5. A printed wiring board according to claim 2, wherein the average crystalline particle diameter of the second electrolytic plated layers is in a range of 7 to 15 times greater than the average crystalline particle diameter of the first electrolytic plated layer.

6. A printed wiring board according to claim 1, wherein the insulative resin substrate comprises glass cloth and a cured resin material.

7. A printed wiring board according to claim 1, wherein the first conductive layer includes a metal foil, the seed layer, the first electrolytic plated layer and the second electrolytic plated layer, and the second conductive layer includes a metal foil, the seed layer, the first electrolytic plated layer and the second electrolytic plated layer.

8. A printed wiring board according to claim 1, wherein the electrolytic plating of the first electrolytic plated layer has crystalline particle diameter in a range of 0.3 μm to 10 μm, and the electrolytic plating of the second electrolytic plated layer has crystalline particle diameter in a range of 5 μm to 30 μm.

9. A printed wiring board according to claim 2, wherein the electrolytic plating of the first electrolytic plated layer has crystalline particle diameter in a range of 0.3 μm to 10 μm, and the electrolytic plating of the second electrolytic plated layer has crystalline particle diameter in a range of 5 μm to 30 μm.

10. A printed wiring board according to claim 3, wherein the electrolytic plating of the first electrolytic plated layer has crystalline particle diameter in a range of 0.3 μm to 10 μm, and the electrolytic plating of the second electrolytic plated layer has crystalline particle diameter in a range of 5 μm to 30 μm.

11. A printed wiring board according to claim 4, wherein the electrolytic plating of the first electrolytic plated layer has crystalline particle diameter in a range of 0.3 μm to 10 μm, and the electrolytic plating of the second electrolytic plated layer has crystalline particle diameter in a range of 5 μm to 30 μm.

12. A printed wiring board according to claim 5, wherein the electrolytic plating of the first electrolytic plated layer has crystalline particle diameter in a range of 0.3 μm to 10 μm, and the electrolytic plating of the second electrolytic plated layer has crystalline particle diameter in a range of 5 μm to 30 μm.

13. A printed wiring board according to claim 1, wherein the penetrating hole is a straight hole penetrating through the insulative resin substrate.

14. A method for manufacturing a printed wiring board, comprising:

forming a penetrating hole through an insulative resin substrate;

forming a first conductive layer on a first surface of the insulative resin substrate;

forming a second conductive layer on a second surface of the insulative resin substrate on an opposite side with respect to the first surface; and forming in the penetrating hole a through-hole conductor connecting the first conductive layer and the second conductive layer, wherein the forming of the through-hole conductor includes forming a seed layer on an inner wall of the penetrating hole, forming on the seed layer a first electrolytic plated layer such that the first electrolytic plated layer fills a space formed by the seed layer in the penetrating hole and forms recessed portions at end portions of the penetrating hole, respectively, and forming a plurality of second electrolytic plated layers such that the second electrolytic plated layers fill the recessed portions formed by the first electrolytic plated layer, respectively, and the forming of the second electrolytic plated layers comprise forming electrolytic plating having an average crystalline particle diameter which is greater than an average crystalline particle diameter of electrolytic plating forming the first electrolytic plated layer.

15. A method for manufacturing a printed wiring board according to claim 14, wherein the forming of the first electrolytic plated layer comprises electrically plating the electrical plating of the first electrolytic plated layer by applying a PPR current.

16. A method for manufacturing a printed wiring board according to claim 15, wherein the PPR current electrolytic plating is set such that a current density of dissolution is in a range of 5 to 20 times greater than a current density for deposition.

17. A method for manufacturing a printed wiring board according to claim 14, wherein the average crystalline particle diameter of the second electrolytic plated layers is in a range of 7 to 15 times greater than the average crystalline particle diameter of the first electrolytic plated layer.

18. A method for manufacturing a printed wiring board according to claim 15, wherein the average crystalline particle diameter of the second electrolytic plated layers is in a range of 7 to 15 times greater than the average crystalline particle diameter of the first electrolytic plated layer.

19. A method for manufacturing a printed wiring board according to claim 14, wherein the first conductive layer includes a metal foil, the seed layer, the first electrolytic plated layer and the second electrolytic plated layer, and the second conductive layer includes a metal foil, the seed layer, the first electrolytic plated layer and the second electrolytic plated layer.

20. A method for manufacturing a printed wiring board according to claim 14, wherein the electrolytic plating of the first electrolytic plated layer is formed to have crystalline particle diameter in a range of 0.3 μm to 10 μm, and the electrolytic plating of the second electrolytic plated layer is formed to crystalline particle diameter in a range of 5 μm to 30 μm.

* * * * *